United States Patent
Wu et al.

(10) Patent No.: US 6,440,873 B1
(45) Date of Patent: Aug. 27, 2002

(54) POST METAL ETCH CLEANING METHOD

(75) Inventors: Chih-Ning Wu, Hsinchu; Chan-Lon Yang, Taipei, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/792,952

(22) Filed: Feb. 26, 2001

(30) Foreign Application Priority Data

Feb. 15, 2001 (TW) ........................................ 90103359 A

(51) Int. Cl.$^7$ ................................................ H01L 21/00
(52) U.S. Cl. ............................ 438/745; 134/3; 216/75; 216/100; 438/720; 438/754
(58) Field of Search ................... 438/720, 725, 438/745, 754; 134/2, 3, 28, 41; 216/67, 75, 100

(56) References Cited

U.S. PATENT DOCUMENTS

| | | | |
|---|---|---|---|
| 5,478,436 A | * 12/1995 | Winebarger et al. | ........ 134/3 X |
| 6,191,086 B1 | * 2/2001 | Leon et al. | ................. 134/3 X |
| 6,310,018 B1 | * 10/2001 | Behr et al. | .................. 134/3 X |

* cited by examiner

*Primary Examiner*—William A. Powell
(74) *Attorney, Agent, or Firm*—J. C. Patents

(57) ABSTRACT

A post metal etch cleaning method which begins by providing a wafer with an etched metal layer formed thereon, wherein the etched metal layer is covered with a polymer residue. A fluorine based organic acid solvent is used to clean the metal layer, followed by removing the solvent by a physical method. Next, a de-ionized water is applied to flush the metal layer before performing a drying step on the wafer to dry the metal layer.

20 Claims, 1 Drawing Sheet

POST METAL ETCH CLEANING METHOD

CROSS-REFERENCE TO RELATED APPLICATION

This application claims the priority benefit of Taiwan application serial no. 90103359, filed Feb. 15, 2001.

BACKGROUND OF THE INVENTION

1. Field of the Invention

The invention relates in general to a post metal etch cleaning method. More particularly, this invention relates to a one-solvent wet cleaning approach to clean a metal line after being patterned and etched.

2. Description of the Related Art

In the conventional method for patterning or defining a metal line, a patterned photoresist layer is typically formed on a metal layer with a portion of the metal layer exposed. The exposed metal layer is then removed using the photoresist layer as a mask. The photoresist layer is then removed to complete the pattern of the metal line.

However, for the aluminum (Al) or aluminum-copper (Al—Cu) alloy metal layer, the etching gas to remove the metal layer normally contains oxygen that will be reacted with the photoresist layer to form polymer residue on sidewall of the metal line. Therefore, a post cleaning step is usually performed after patterning the metal line to remove the polymer residue.

In the conventional post metal etch cleaning method, a hydroxyamine based ($NH_2OH$) solvent is used to clean the metal line. A 1-mephyl-2-pyrrolidinone (NMP) solvent is further used as the intermediate solvent to clean the metal line. A de-ionized water is then used to rinse the metal line, followed by evaporating the de-ionized water with iso-propyl alcohol (IPA) to dry the metal line.

In the method described above, when the hydroxyamine based solvent reacts with water, the reaction produces a $OH^-$ free radical which can easily react with Al or Al—Cu alloy to cause corrosion or galvanic reaction of the metal line. However, if one tried to adjust the composition or condition of the hydroxyamine based solvent in order to resolve the corrosion or the galvanic reaction problem, it is very likely that the polymer residue cannot be cleaned or removed thoroughly.

In addition, the intermediate solvent, that is, the NNW solvent, used in the above conventional method is to replace the amine based solvent which may destroy the hydroxyl contained in the de-ionized water and attack Al or Al—Cu. However, to adjust the proportion of such solvent in order to remove the polymer residue thoroughly without damaging the metal line is very difficult.

SUMMARY OF THE INVENTION

The invention provides a post metal etch cleaning method. An Al or Al—Cu metal layer is formed. A photoresist layer is formed on the metal layer, and a portion of the metal layer is exposed. The exposed metal layer is etched away. The photoresist layer is removed. A fluorine-based organic acid solvent is used to rinse the metal layer, followed by removing the fluorine-based organic acid solvent by a physical method. The metal layer is then flushed with a de-ionized water which is later evaporated off in a drying step, so as to dry the metal layer.

The invention also provides a post metal etch cleaning method and its application to the fabrication method for the metal line. The method begins by providing a substrate with a metal layer formed thereon. A photoresist layer is then formed on the substrate, so that a portion of the metal layer is exposed. The exposed metal layer is etched away. The photoresist layer is removed. A fluorine-based organic acid solvent is used to rinse the metal layer, followed by spinning off the fluorine-based organic acid solvent by a physical method. The metal layer is then flushed with de-ionized water which is later removed in a drying step, so as to dry the metal layer.

By the method provided in the invention, the polymer residue formed on the metal line can be removed effectively without damaging the metal line. In addition, the process window can be widened, the cleaning efficiency is enhanced while the metal corrosion or galvanic reaction is prevented. Furthermore, the consumption of the solvent is reduced to lower the fabrication cost, and the throughput is thus greatly improved.

Both the foregoing general description and the following detailed description are exemplary and explanatory only and are not restrictive of the invention, as claimed.

DESCRIPTION OF THE PREFERRED EMBODIMENTS

Figure 1:
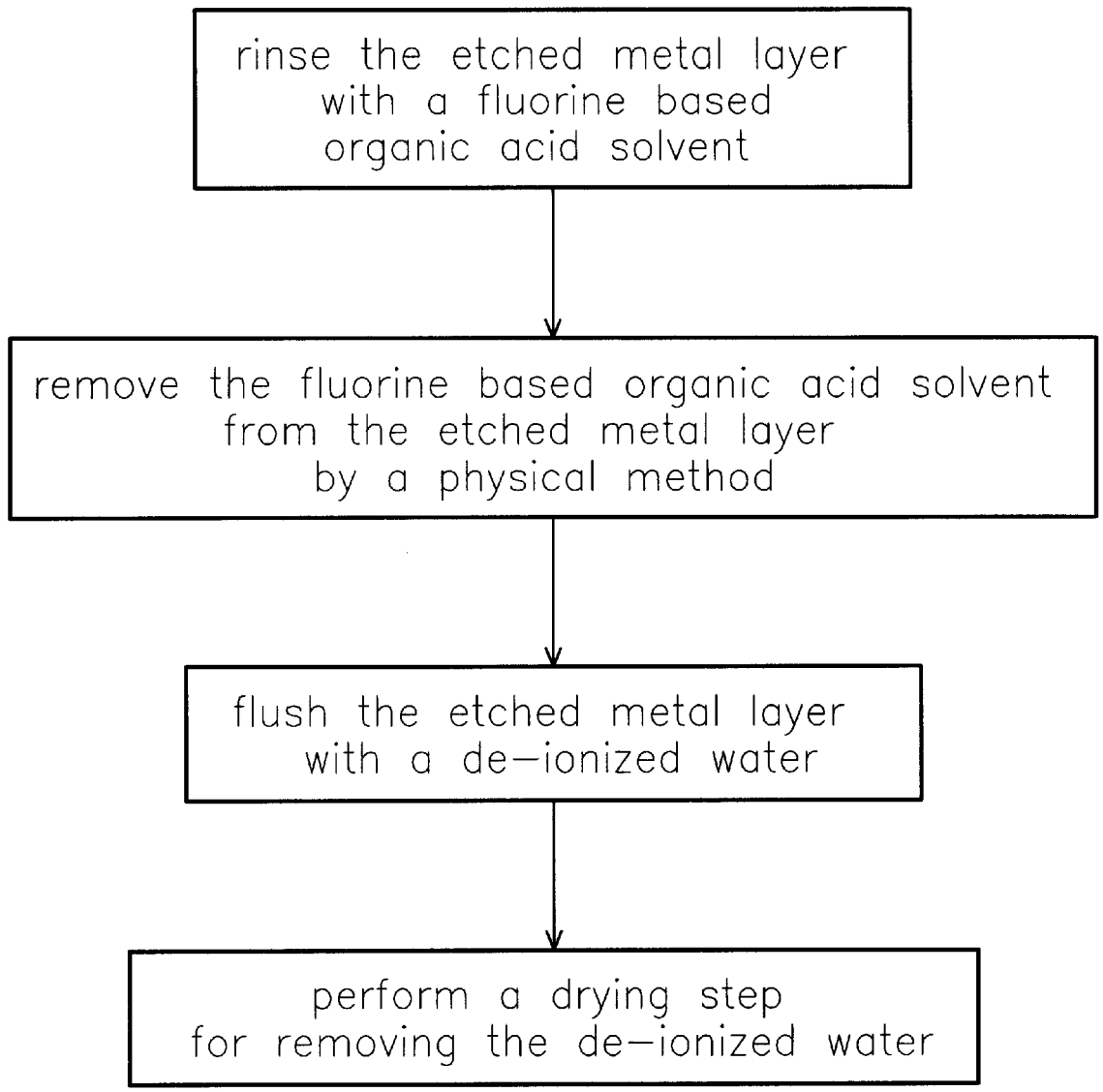
FIGS. 1 is a process flow of the post metal etch cleaning method according to one preferred embodiment of the invention.

FIG. 1 shows a process flow of an embodiment for cleaning a metal line after which is patterned and the photoresist layer to define the metal line is removed. In the method as illustrated in FIG. 1, a one-solvent wet cleaning approach is used, and at least three steps are included.

A wafer is provided with a metal layer, for example, an aluminum, aluminumcopper alloy or copper layer, formed thereon. A patterned photoresist layer is formed on the metal layer, while a portion of the metal layer is exposed. The exposed metal layer is then etched to form the metal line using an etching gas, typically containing chlorine ($Cl_2$). The photoresist layer is then removed. Since the etching gas may contain chlorine, carbon and other gases, it is inevitable that the etching gas reacts with the metal layer to form polymer residue on the metal line.

As shown in FIG. 1, it therefore necessary to perform the post metal etch cleaning step. In this invention, a fluorine based organic acid solvent is used to clean the metal line, so as to remove the polymer residue on the metal line. The fluorine based organic acid solvent may contain, acetyl fluoride ($CH_3COOF$) acid solvent, such as the ACT NE series solvent prepared by American company, Ashland Co., Led., U.S.A. This kind of solvent includes a chelating agent to chelate with metal from the metal line, so that the polymer residue can be thoroughly removed without attacking the metal line, since the metal corrosion does not occur easily under acidic condition. Next, the fluorine based organic acid solvent is removed by a physical method. Preferably, the physical method includes spinning the wafer for spinning off any fluorine based organic acid solvent left on the wafer.

The metal line is then flushed with a de-ionized water, followed by performing a drying step to dry the wafer. The drying step includes evaporating off the de-ionized water on the wafer by applying an iso-propyl-alcohol (IPA). The wafer can also be dried by a nitrogen purging method which blows nitrogen gas to dry off the de-ionized water on the metal line.

Using the above one-solvent cleaning method, the polymer residue can be effectively removed. Moreover, the fluorine based organic acid solvent does not corrode the aluminum, aluminum-copper or copper layer, so that the metal corrosion occurred in the conventional method is prevented, and no metal line will be damaged. In addition, since only one kind of cleaning solvent is used, the consumption of cleaning solvent is greatly reduced, the fabrication cost is consequently lowered. Furthermore, since there is no worry of corroding or damaging the metal line, the process window is widened, and the throughput is enhanced.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A post metal etch cleaning method, comprising:

providing a substrate with a etched metal layer formed thereon, wherein the etched metal layer is covered with a polymer residue;

rinsing the metal layer with a fluorine based organic acid solvent for removing the polymer residue;

flushing the metal layer with a de-ionized water; and performing a drying step for removing the de-ionized water.

2. The method according to claim 1, wherein the metal layer includes a metal line.

3. The method according to claim 2, wherein the metal line includes an aluminum line.

4. The method according to claim 2, wherein the metal line includes an aluminum-copper line.

5. The method according to claim 2, wherein the metal line includes a copper line.

6. The method according to claim 1, wherein the fluorine based organic acid solvent includes an acetyl fluoride ($CH_3COOF$) acid.

7. The method according to claim 1, wherein the fluorine based organic acid solvent includes a chelating agent for chelating with metal from the metal layer.

8. The method according to claim 1, further includes a physical method to remove the fluorine based organic acid solvent after the step of rinsing the metal layer with a fluorine based organic acid solvent and before the step of flushing the metal layer with a de-ionized water.

9. The method according to claim 8, wherein the physical method includes spinning a wafer for removing the fluorine based organic acid solvent on the wafer.

10. The method according to claim 1, wherein the drying step includes a nitrogen purging.

11. The method according to claim 1, wherein the drying step includes evaporating off the de-ionized water using an iso-propyl alcohol (IPA).

12. A method of forming a metal line, comprising:

providing a substrate with a metal layer formed thereon;

forming a photoresist layer on the metal layer, so that a portion of the metal layer is exposed;

etching the exposed metal layer to form a metal line;

removing the photoresist layer;

rinsing the metal line with a fluorine based organic acid solvent;

spinning off the fluorine based organic acid solvent on the wafer, flushing the metal line with a de-ionized water; and performing a drying step on the wafer for removing the de-ionized water.

13. The method according to claim 12, wherein the metal layer includes an aluminum layer.

14. The method according to claim 12, wherein the metal layer includes an aluminum-copper layer.

15. The method according to claim 12, wherein the metal layer includes a copper layer.

16. The method according to claim 12, wherein the fluorine based organic acid solvent includes a $CH_3COOF$ solution.

17. The method according to claim 12, wherein the fluorine based organic acid solvent includes a chelating agent for chelating with metal from the metal layer.

18. The method according to claim 12, wherein the drying step includes a nitrogen purging.

19. The method according to claim 12, wherein the drying step includes evaporating using an iso-propyl alcohol (IPA).

20. The method according to claim 12, comprising further a step of consequently forming a polymer residue on a sidewall of the metal line after the exposed metal layer is etched.

* * * * *